(12) United States Patent
Narita et al.

(10) Patent No.: US 9,468,135 B2
(45) Date of Patent: Oct. 11, 2016

(54) SUBSTRATE CONVEYING SYSTEM FOR ELECTRONIC COMPONENT MOUNTING DEVICE

(71) Applicant: YAMAHA HATSUDOKI KABUSHIKI KAISHA, Shizuoka (JP)

(72) Inventors: Yoshitaka Narita, Iwata (JP); Kazuaki Yamada, Iwata (JP)

(73) Assignee: YAMAHA HATSUDOKI KABUSHIKI KAISHA, Shizuoka (JP)

(*) Notice: Subject to any disclaimer, the term of this patent is extended or adjusted under 35 U.S.C. 154(b) by 0 days.

(21) Appl. No.: 14/765,511

(22) PCT Filed: Feb. 8, 2013

(86) PCT No.: PCT/JP2013/053023
§ 371 (c)(1),
(2) Date: Aug. 3, 2015

(87) PCT Pub. No.: WO2014/122769
PCT Pub. Date: Aug. 14, 2014

(65) Prior Publication Data
US 2015/0382519 A1 Dec. 31, 2015

(51) Int. Cl.
*B65G 47/46* (2006.01)
*H05K 13/00* (2006.01)
(Continued)

(52) U.S. Cl.
CPC ........... *H05K 13/0015* (2013.01); *B65G 37/00* (2013.01); *B65G 47/261* (2013.01); *H05K 13/0061* (2013.01)

(58) Field of Classification Search
CPC ...... B65G 47/52; B65G 47/71; B65G 37/00; B65G 47/46
USPC ............................................ 198/369.1, 370.1
See application file for complete search history.

(56) References Cited

U.S. PATENT DOCUMENTS 4,301,958 A * 11/1981 Hatakenaka ...... H01L 21/67144
198/341.04
5,826,699 A * 10/1998 Trauten .................. B65G 47/53
198/370.1
(Continued)

FOREIGN PATENT DOCUMENTS

EP 0196560 A2 10/1986
JP 2002-208797 A 7/2002
(Continued)

OTHER PUBLICATIONS

International Search Report; PCT/JP2013/053023; Apr. 23, 2013.
(Continued)

*Primary Examiner* — James R Bidwell
(74) *Attorney, Agent, or Firm* — Studebaker & Brackett PC (57) ABSTRACT

A substrate conveying system includes a mounting device conveyor for conveying a printed substrate in a first horizontal direction, an upstream-side conveyor, a downstream-side conveyor, and a buffer conveyor. The mounting device conveyor has a function of moving the printed substrate in a horizontal Y direction perpendicular to the conveying direction. The upstream-side conveyor is spaced apart from the downstream-side conveyor in the Y direction. The buffer conveyor has a function of conveying the printed substrate in the first direction, and a function of moving the printed substrate in the Y direction. When the mounting device conveyor and the buffer conveyor are positioned in the same position in the Y direction, the printed substrate is transferred from one of these conveyors to the other.

4 Claims, 7 Drawing Sheets

(51) Int. Cl.
*B65G 37/00* (2006.01)
*B65G 47/26* (2006.01)

(56) References Cited

U.S. PATENT DOCUMENTS

| | | | |
|---|---|---|---|
| 2002/0062554 A1 | 5/2002 | Hwang et al. | |
| 2004/0211059 A1 | 10/2004 | Kim et al. | |
| 2005/0269184 A1* | 12/2005 | Enya .................. | B65G 37/02 198/369.2 |
| 2007/0272519 A1* | 11/2007 | Swoboda ............ | B65G 37/02 198/780 |
| 2009/0250313 A1 | 10/2009 | Kimura et al. | |
| 2013/0105275 A1* | 5/2013 | Lim .................... | B65G 47/648 198/369.1 |

FOREIGN PATENT DOCUMENTS

| | | |
|---|---|---|
| JP | 2002-217592 A | 8/2002 |
| JP | 2002-271091 A | 9/2002 |
| JP | 2007-184309 A | 7/2007 |
| JP | 2008-192824 A | 8/2008 |
| JP | 4883071 B2 | 2/2012 |
| KR | 900000695 B1 | 2/1990 |
| KR | 2002-0040415 A | 5/2002 |

OTHER PUBLICATIONS

The Extended European Search Report issued by the European Patent Office on Jan. 16, 2016, which corresponds to European Patent Application No. 13874562.5-1803.
An Office Action; Notification of Reason for Refusal issued by the Korean Patent Office on Jun. 20, 2016, which corresponds to Korean Patent Application No. 2015-7020945 and is related to U.S. Appl. No. 14/765,511; with English language translation.

* cited by examiner

SUBSTRATE CONVEYING SYSTEM FOR ELECTRONIC COMPONENT MOUNTING DEVICE

CROSS-REFERENCE TO RELATED APPLICATION

This application claims benefit of priority to International Patent Application No. PCT/JP2013/053023 filed Feb. 8, 2013, the entire content of which is incorporated herein by reference.

TECHNICAL FIELD

The present disclosure relates to a substrate conveying system for an electronic component mounting device, which conveys a printed substrate to an electronic component mounting apparatus, printed substrate solder printing apparatus, or the like.

BACKGROUND

An example of the conventional substrate conveying system for conveying a printed substrate to an electronic component mounting device such as an electronic component mounting apparatus or printed substrate solder printing apparatus is described in Japanese Patent No. 4883071.

This substrate conveying system disclosed in Japanese Patent No. 4883071 includes a substrate distributing apparatus between a screen printing apparatus, and a coating/testing apparatus positioned downstream of the screen printing apparatus.

This substrate distributing apparatus moves a printed substrate in a direction that is horizontal and perpendicular to the conveying direction.

A printed substrate coated with solder by the screen printing apparatus is conveyed from the screen printing apparatus to the substrate distributing apparatus. Then, the printed substrate is moved in the direction that is horizontal and perpendicular to the conveying direction by the substrate distributing apparatus, and conveyed to the coating/testing apparatus.

BACKGROUND

Problem to be Solved by the Disclosure

The substrate conveying system for an electronic component mounting device described in Japanese Patent No. 4883071 has the problem that the system cannot efficiently convey a printed substrate for the following reason. For example, it is sometimes impossible to rapidly convey a printed substrate having undergone the printing process by the screen printing apparatus to the substrate distributing apparatus on the downstream side.

The above-mentioned substrate distributing apparatus cannot load a next printed substrate from the screen printing apparatus unless a printed substrate is conveyed to the coating/testing apparatus. Therefore, if loading of a printed substrate is not permitted by the coating/testing apparatus, a printed substrate is held in the substrate distributing apparatus, so a printed substrate stays in the screen printing apparatus as described above.

That is, in the substrate conveying system described in Japanese Patent No. 4883071, it is sometimes impossible to simultaneously load and unload printed substrates in the screen printing apparatus. This decreases the printed substrate conveyance efficiency as described above. Inconvenience caused by staying of printed substrates like this occurs not only in the screen printing apparatus, but also in other electronic component mounting devices such as the coating/testing apparatus and electronic component mounting apparatus.

The present disclosure has been made to solve this problem, and has as its object to achieve efficient printed substrate conveyance in a substrate conveying system in which the loading and unloading positions of a printed substrate are misaligned in a direction perpendicular to the conveying direction.

Means of Solution to the Problem

To achieve the above object, a substrate conveying system for an electronic component mounting device according to the present disclosure comprises a mounting device conveyor configured to convey a printed substrate from one end portion to the other end portion of the electronic component mounting device in a first direction that is horizontal, an upstream-side conveyor configured to unload the printed substrate from an upstream-side apparatus positioned upstream of the electronic component mounting device in a conveying direction of the printed substrate, a downstream-side conveyor configured to load the printed substrate onto a downstream-side apparatus positioned downstream of the electronic component mounting device in the conveying direction of the printed substrate, and a buffer conveyor arranged between at least one of the upstream-side conveyor and the downstream-side conveyor and the mounting device conveyor, wherein the mounting device conveyor has a function of moving the printed substrate in a second direction that is horizontal and perpendicular to the conveying direction, the upstream-side conveyor is spaced apart from the downstream-side conveyor in the second direction, the buffer conveyor has a function of conveying the printed substrate in the first direction, and a function of moving the printed substrate in the second direction, and the printed substrate is transferred from one of the mounting device conveyor and the buffer conveyor to the other in a state in which the mounting device conveyor and the buffer conveyor are positioned in the same position in the second direction.

SUMMARY

There is provided the substrate conveying system for an electronic component mounting device according to the above-mentioned disclosure, wherein the buffer conveyor includes a downstream-side buffer conveyor installed between the downstream-side conveyor and the mounting device conveyor, and when the mounting device conveyor has an unloadable printed substrate and the downstream-side buffer conveyor is on standby in an unloading position in the second direction where the printed substrate is unloaded, the mounting device conveyor moves to the unloading position in the second direction.

There is provided the substrate conveying system for an electronic component mounting device according to the above-mentioned disclosure, wherein the buffer conveyor includes a downstream-side buffer conveyor installed between the downstream-side conveyor and the mounting device conveyor, when the mounting device conveyor has an unloadable printed substrate, the mounting device conveyor moves to a next position in the second direction where a step next to a printed substrate unloading step is performed, and the downstream-side buffer conveyor moves to the next position in the second direction when no printed substrate is placed on the downstream-side buffer conveyor.

There is provided the substrate conveying system for an electronic component mounting device according to the above-mentioned disclosure, wherein the buffer conveyor includes an upstream-side buffer conveyor installed between the upstream-side conveyor and the mounting device conveyor, and when the mounting device conveyor is on standby in an unloading position in the second direction where the printed substrate is unloaded, the upstream-side buffer conveyor moves to the unloading position.

There is provided the substrate conveying system for an electronic component mounting device according to the above-mentioned disclosure, wherein the buffer conveyor includes an upstream-side buffer conveyor installed between the upstream-side conveyor and the mounting device conveyor, and when the mounting device conveyor is on standby in a working position in the second direction where the electronic component mounting device performs work, the upstream-side buffer conveyor moves to the working position.

Effects of the Disclosure

In the present disclosure, a printed substrate to be loaded from the above-mentioned upstream-side apparatus to the above-mentioned mounting device conveyor or a printed substrate to be unloaded from the mounting device conveyor to the downstream-side apparatus can temporarily be held in the buffer conveyor. This can prevent a delay of conveyance of a printed substrate by using the buffer conveyor. Accordingly, the present disclosure increases the printed substrate conveyance efficiency in a substrate conveying system in which the loading and unloading positions of a printed substrate are misaligned in the above-mentioned second direction.

DETAILED DESCRIPTION

Best Mode for Carrying Out the Disclosure

An embodiment of a substrate conveying system for an electronic component mounting device according to the present disclosure will be explained in detail below with reference to FIGS. 1 to 10.

Figure 1:
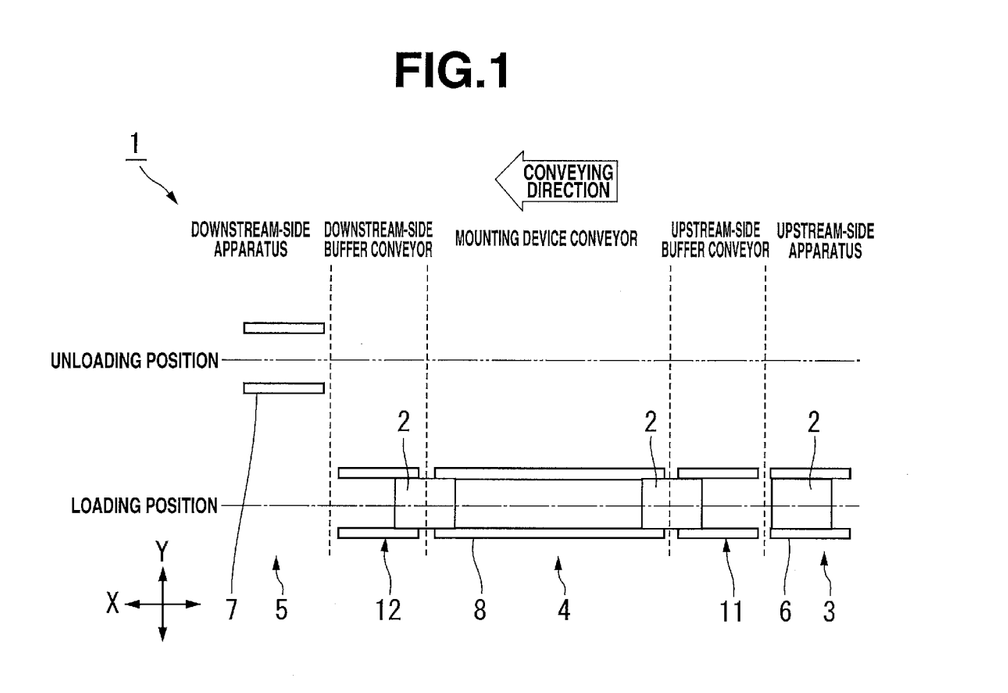
FIG. 1 is a plan view showing the arrangement of a substrate conveying system for an electronic component mounting device according to the present disclosure.

A substrate conveying system 1 shown in FIG. 1 conveys a printed substrate 2 from an upstream-side apparatus 3 to an electronic component mounting device 4, and conveys the printed substrate 2 processed by the electronic component mounting device from the electronic component mounting device 4 to a downstream-side apparatus 5. The substrate conveying system 1 conveys the printed substrate 2 from the upstream-side apparatus to the downstream-side apparatus 5 in a first horizontal direction. The first direction will simply be referred to as an X direction hereinafter.

The upstream-side apparatus 3 is an apparatus for performing a pre-process of a process to be performed by the electronic component mounting device 4 (to be described later). The upstream-side apparatus 3 is positioned upstream of the electronic component mounting device 4 in the conveying direction of the printed substrate 2. The upstream-side apparatus 3 includes an upstream-side conveyor 6 for unloading the printed substrate 2.

The downstream-side apparatus 5 is an apparatus for performing a post-process of the process to be performed by the electronic component mounting device 4. The downstream-side apparatus 5 is positioned downstream of the electronic component mounting device 4 in the conveying direction of the printed substrate 2. The downstream-side apparatus 5 includes a downstream-side conveyor 7 for loading the printed substrate 2. The upstream-side conveyor 6 is spaced apart from the downstream-side conveyor 7 at a predetermined distance in a second direction that is horizontal and perpendicular to the X direction. The second direction will simply be referred to as a Y direction hereinafter.

The electronic component mounting device 4 is a device for performing some work by using the printed substrate 2. Although not shown, examples of the electronic component mounting device 4 are a screen printing apparatus for coating the printed substrate 2 with solder paste, and an electronic component mounting apparatus for mounting an electronic component on the printed substrate 2. The electronic component mounting device 4 includes a mounting device conveyor 8 for conveying the printed substrate 2 in the X direction from one end portion to the other end portion of the electronic component mounting device 4.

The mounting device conveyor 8 has a function of moving the printed substrate 2 in the Y direction. The mounting device conveyor 8 is movable in the Y direction between the same position as that of the upstream-side conveyor 6 and the same position as that of the downstream-side conveyor 7.

The electronic component mounting device 4 performs work on the printed substrate 2 while the mounting device conveyor 8 is standing still between one end and the other end in the Y direction. This work is mounting of an electronic component when the electronic component mounting device 4 is an electronic component mounting apparatus.

An upstream-side buffer conveyor 11 is installed between the upstream-side conveyor 6 and mounting device conveyor 8. In addition, a downstream-side buffer conveyor 12 is installed between the downstream-side conveyor 7 and mounting device conveyor 8. In this embodiment, the upstream-side buffer conveyor 11 and downstream-side buffer conveyor 12 form so-called "buffer conveyors" of the present disclosure.

The upstream-side buffer conveyor 11 and downstream-side buffer conveyor 12 have a function of conveying the printed substrate 2 in the X direction, and a function of moving the printed substrate 2 in the Y direction.

The upstream-side buffer conveyor 11 and downstream-side buffer conveyor 12 are movable in the Y direction between the same position as that of the upstream-side conveyor 6 and the same position as that of the downstream-side conveyor 7.

Figure 2:
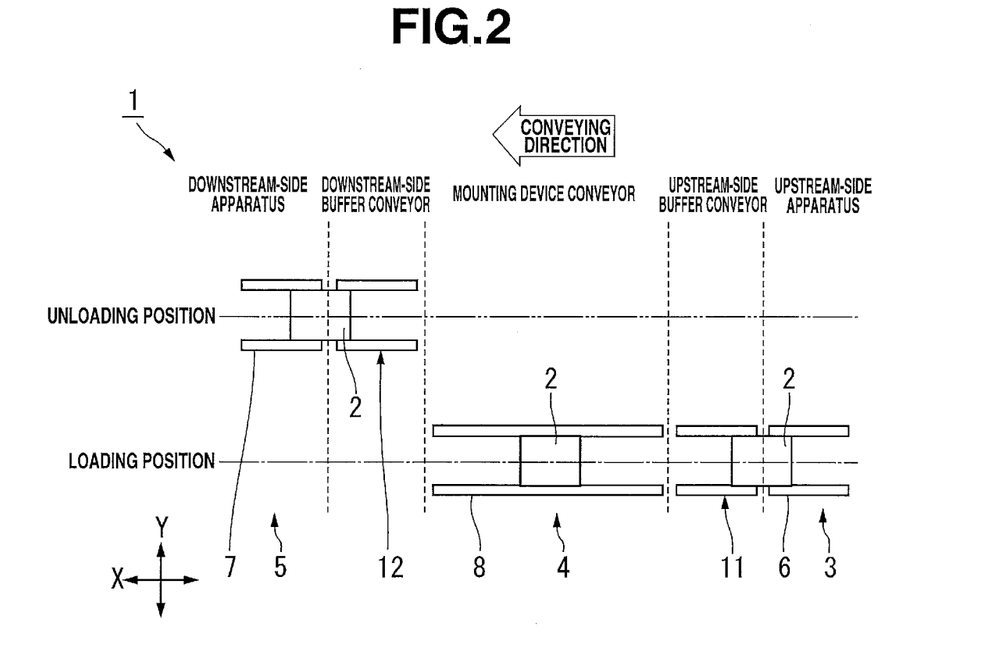
FIG. 2 is a plan view showing the arrangement of the substrate conveying system for an electronic component mounting device according to the present disclosure.
Figure 3:
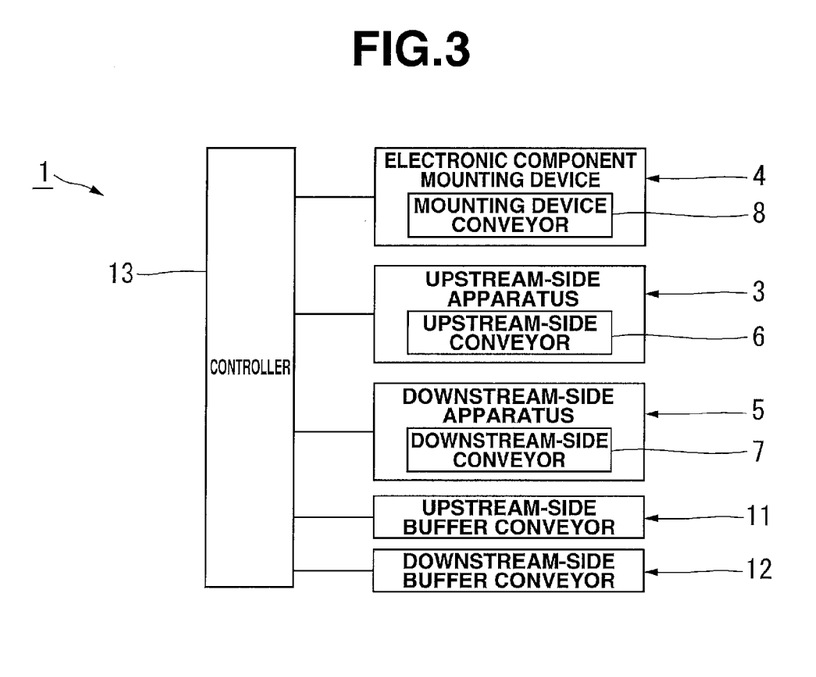
FIG. 3 is a block diagram showing the configuration of a control system.

As shown in FIG. 2, when the upstream-side buffer conveyor 11 is positioned in the same position as that of the upstream-side conveyor 6 in the Y direction, the printed substrate 2 can be transferred from the upstream-side conveyor 6 to the upstream-side buffer conveyor 11.

As shown in FIG. 1, when the upstream-side buffer conveyor 11 is positioned in the same position as that of the mounting device conveyor 8 in the Y direction, the printed substrate 2 can be transferred from the upstream-side buffer conveyor 11 to the mounting device conveyor 8.

As shown in FIG. 1, when the downstream-side buffer conveyor 12 is positioned in the same position as that of the mounting device conveyor 8 in the Y direction, the printed substrate 2 can be transferred from the mounting device conveyor 8 to the downstream-side buffer conveyor 12.

As shown in FIG. 2, when the downstream-side buffer conveyor 12 is positioned in the same position as that of the downstream-side conveyor 7 in the Y direction, the printed substrate 2 can be transferred from the downstream-side buffer conveyor 12 to the downstream-side conveyor 7.

A controller 13 (see FIG. 3) of the electronic component mounting device 4 controls the operations of the mounting device conveyor 8, upstream-side buffer conveyor 11, and downstream-side buffer conveyor 12.

As shown in FIG. 1, these conveyors can convey a plurality of printed substrates 2 by cooperating with each other. FIG. 1 shows a state in which the printed substrates 2 are loaded and unloaded at the same time on the mounting device conveyor 8. The printed substrate 2 is loaded onto the mounting device conveyor 8 by transferring the printed substrate 2, which is transferred from the upstream-side conveyor 6 to the upstream-side buffer conveyor 11, from the upstream-side buffer conveyor 11 to the mounting device conveyor 8.

The printed substrate 2 is unloaded from the mounting device conveyor 8 by transferring the printed substrate 2 from the mounting device conveyor 8 to the downstream-side buffer conveyor 12. "LOADING POSITION" shown in FIG. 1 is the same position as that of the upstream-side conveyor 6 in the Y direction. "UNLOADING POSITION" shown in FIG. 1 is the same position as that of the downstream-side conveyor 7 in the Y direction.

As shown in FIG. 2, the printed substrate 2 loaded onto the mounting device conveyor 8 is conveyed to a middle portion of the mounting device conveyor 8 in the conveying direction (X direction), and subjected to work such as electronic component mounting performed by the electronic component mounting device 4. As shown in FIG. 2, the printed substrate 2 transferred from the mounting device conveyor 8 to the downstream-side buffer conveyor 12 is transferred from the downstream-side buffer conveyor 12 to the downstream-side conveyor 7, with the downstream-side buffer conveyor 12 having moved to the same position as that of the downstream-side conveyor 7 in the Y direction.

Next, the operations of the mounting device conveyor 8, upstream-side buffer conveyor 11, and downstream-side buffer conveyor 12 will be explained with reference to flowcharts shown in FIGS. 4 to 6 and schematic views shown in FIGS. 7 to 10.

Figure 4:
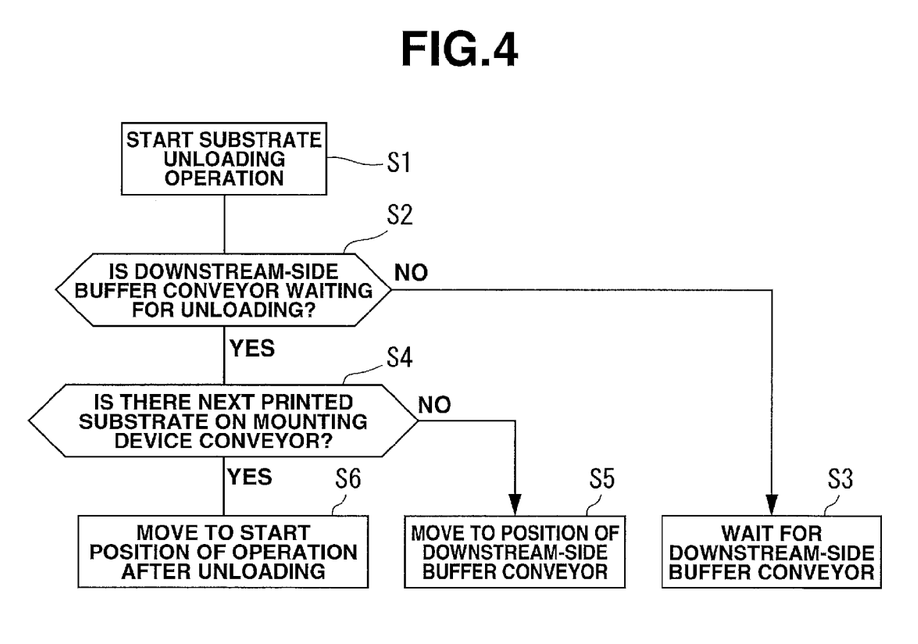
FIG. 4 is a flowchart for explaining the operation of a mounting device conveyor.

When the mounting device conveyor 8 unloads the printed substrate 2, as shown in steps S1 and S2 of the flowchart shown in FIG. 4, the controller 13 first determines whether the downstream-side buffer conveyor 12 is waiting for unloading of the printed substrate 2. If no printed substrate 2 remains in the downstream-side conveyor 7, "NO" is determined, and the process advances to step S3. In step S3, the mounting device conveyor 8 waits until the downstream-side buffer conveyor 12 moves to the downstream side of the mounting device conveyor 8, and transfers the printed substrate 2 to the downstream-side buffer conveyor 12 after that.

If "YES" is determined in step S2, the process advances to step S4, and the controller 13 determines whether the next printed substrate 2 has been transferred to the mounting device conveyor 8. As shown in the upper half of FIG. 7, if no next printed substrate exists in a waiting position 8*a* of the mounting device conveyor 8, "NO" is determined in step S4, and the process advances to step S5. In step S5, as shown in the lower half of FIG. 7, the mounting device conveyor 8 moves to the same position as that of the downstream-side buffer conveyor 12 in the Y direction.

Figure 8:
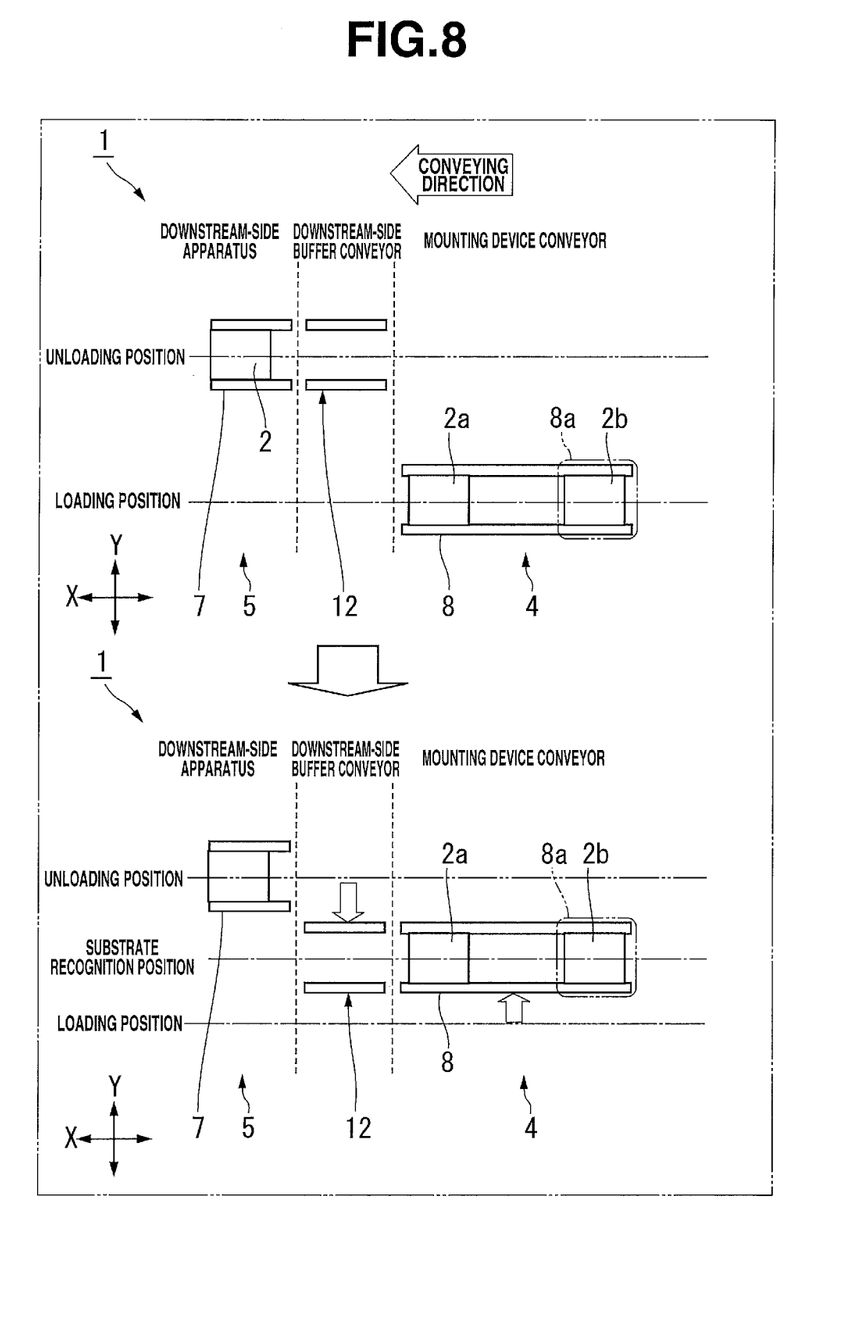
FIG. 8 is a plan view for explaining the operations of the mounting device conveyor and downstream-side buffer conveyor.

On the other hand, if "YES" is determined in step S4, that is, if a processed printed substrate 2*a* and a printed substrate 2*b* to be processed next exist on the mounting device conveyor 8 as shown in the upper half of FIG. 8, the process advances to step S6. In step S6, as shown in the lower half of FIG. 8, the mounting device conveyor 8 moves to the next position in the Y direction. This "next position" is a position in the Y direction where a step next to the printed substrate unloading step is performed.

An example of the "next position" when the electronic component mounting device 4 is an electronic component mounting apparatus is a position at which a camera (not shown) recognizes the printed substrate 2. Note that this "next position" changes from one electronic component mounting device 4 to another.

After the mounting device conveyor 8 has moved to the "next position" as described above, the downstream-side buffer conveyor 12 having unloaded the printed substrate 2 moves to the same position as that of the mounting device conveyor 8 in the Y direction, and the printed substrate 2*a* is transferred from the mounting device conveyor 8 to the downstream-side buffer conveyor 12.

Figure 5:
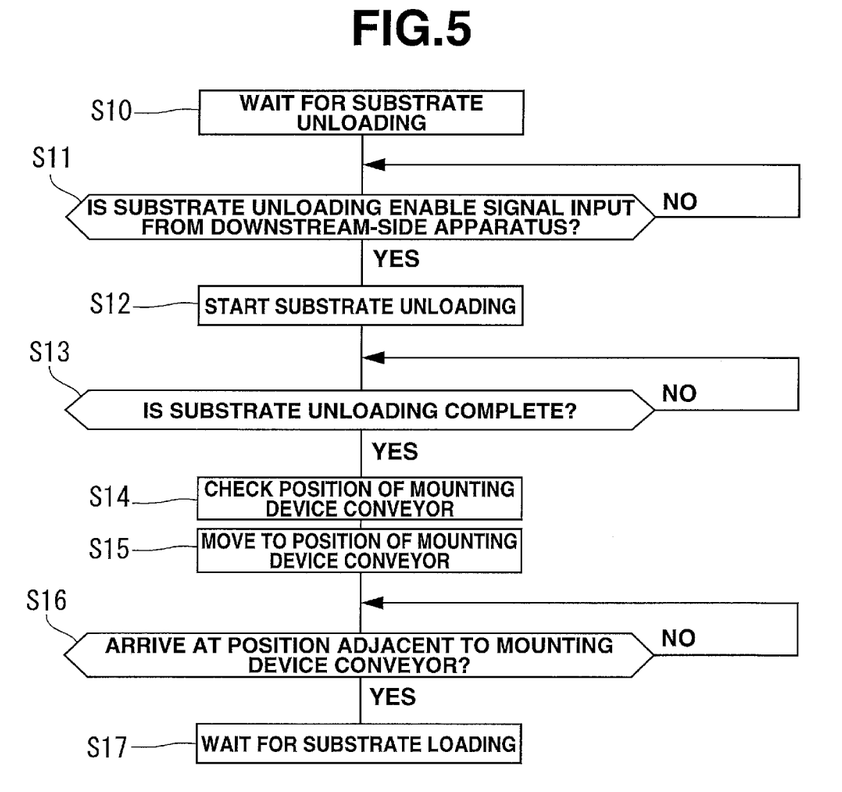
FIG. 5 is a flowchart for explaining the operation of a downstream-side buffer conveyor.

The downstream-side buffer conveyor 12 operates as shown in the flowchart of FIG. 5. As shown in step S10 of the flowchart of FIG. 5, the downstream-side buffer conveyor 12 to which the printed substrate 2 is transferred from the mounting device conveyor 8 moves to a position adjacent to the downstream-side conveyor 7 and waits for the start of unloading of the printed substrate 2.

Then, as shown in steps S11 and S12, after a substrate unloading enable signal is input from the downstream-side apparatus 5 to the controller 13, the downstream-side buffer conveyor 12 starts the operation of unloading the printed substrate 2 under the control of the controller 13.

After this unloading operation is complete, the controller 13 checks the position of the mounting device conveyor 8 in step S14, and moves the downstream-side buffer conveyor 12 to the same position as that of the mounting device conveyor 8 in the Y direction in step S15.

That is, the downstream-side buffer conveyor 12 unloads the printed substrate 2 as shown in the upper half of FIG. 8, and moves to a position adjacent to the mounting device conveyor 8 in the Y direction. If the mounting device conveyor 8 is positioned in the loading position as shown in FIG. 1, the downstream-side buffer conveyor 12 moves to the loading position.

As shown in steps S16 and S17, the downstream-side buffer conveyor 12 moves to the same position as that of the mounting device conveyor 8 (the position adjacent to the mounting device conveyor 8), and waits in a state in which the printed substrate 2 transferred from the mounting device conveyor 8 can be loaded.

Figure 6:
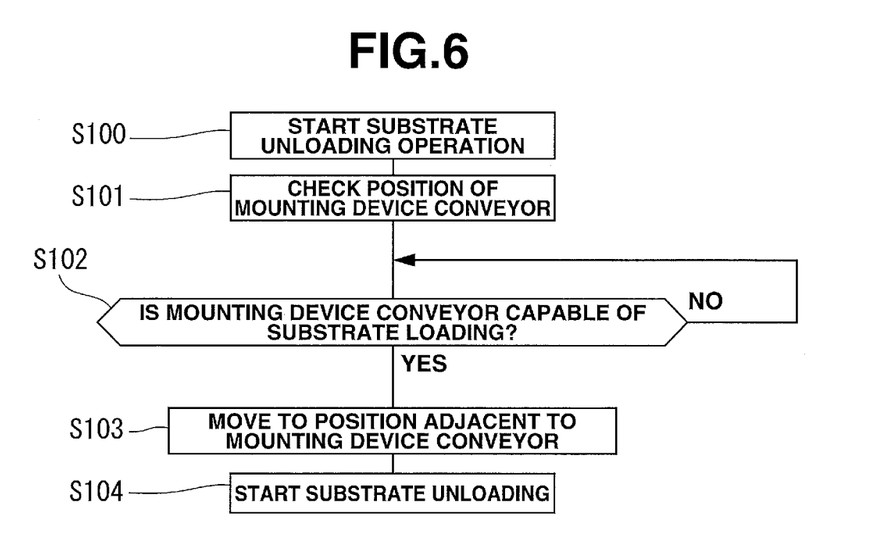
FIG. 6 is a flowchart for explaining the operation of an upstream-side buffer conveyor.
Figure 7:
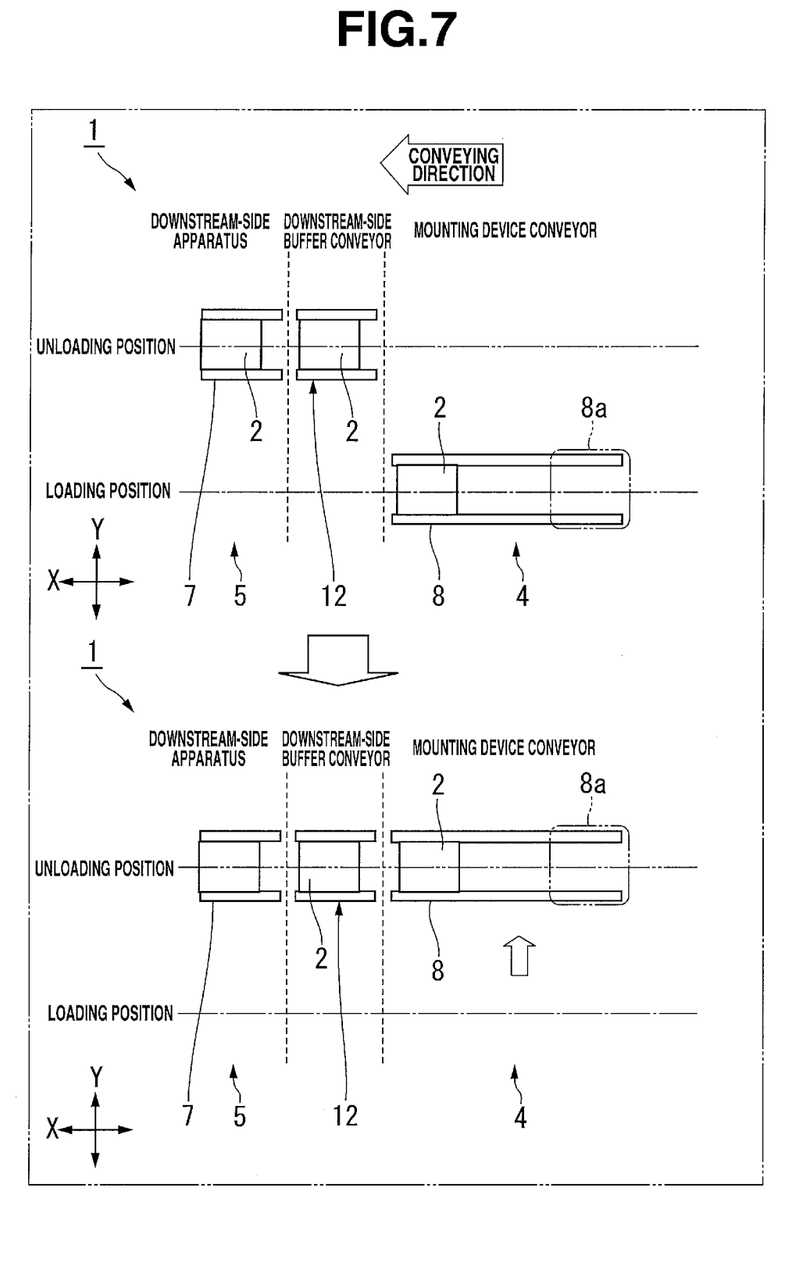
FIG. 7 is a plan view for explaining the operations of the mounting device conveyor and downstream-side buffer conveyor.

The upstream-side buffer conveyor 11 operates as shown in the flowchart of FIG. 6. In step S100 of the flowchart shown in FIG. 6, the upstream-side buffer conveyor 11 to which the printed substrate 2 is transferred from the upstream-side conveyor 6 starts the operation of unloading the printed substrate 2. Then, in step S101, the controller 13 checks the position of the mounting device conveyor 8, and determines whether the mounting device conveyor 8 is capable of loading the printed substrate 2.

Figure 9:
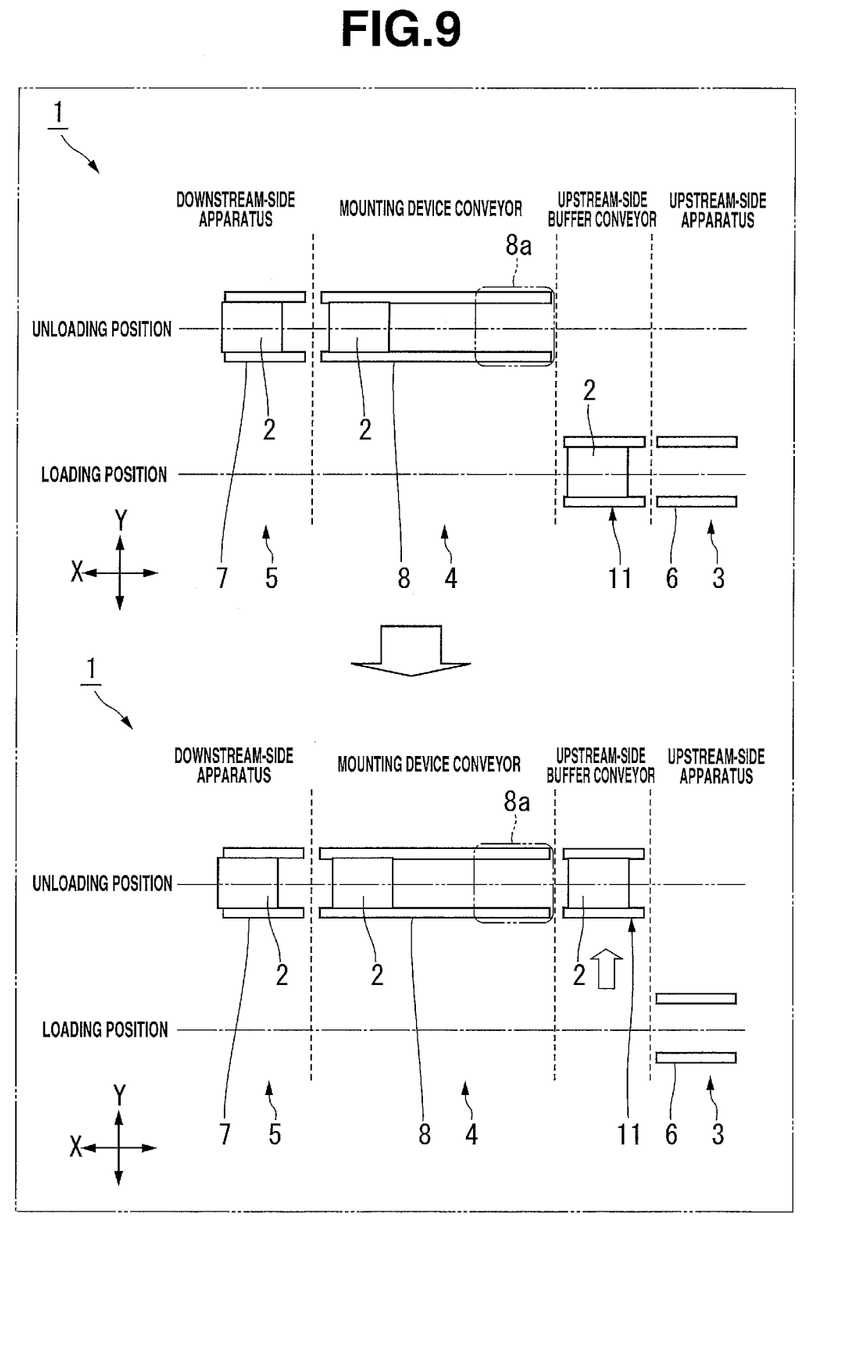
FIG. 9 is a plan view for explaining the operations of the mounting device conveyor and upstream-side buffer conveyor.

The above-mentioned "capable of loading the printed substrate 2" means a state in which no printed substrate 2 exists in the waiting position 8a of the mounting device conveyor 8, and a state in which the mounting device conveyor 8 is not moving in the Y direction (a state in which the mounting device conveyor 8 is standing still for unloading or work). The upper half of FIG. 9 shows a state in which the mounting device conveyor 8 has moved to the unloading position and unloads the printed substrate 2 to the downstream side. The upper half of FIG. 10 shows a state in which the mounting device conveyor 8 has moved to the working position, and the printed substrate 2 is conveyed to the downstream side after the work is complete.

In step S103, if the mounting device conveyor 8 is capable of loading the printed substrate 2 as described above, the controller 13 moves the upstream-side buffer conveyor 11 to the same position as that of the mounting device conveyor 8 in the Y direction. In this step, if the mounting device conveyor 8 has already moved to the adjacent position as shown in FIG. 1, the upstream-side buffer conveyor 11 does not move but stands still in the current position. Also, if the mounting device conveyor 8 is in the unloading position as shown in the upper half of FIG. 9, the upstream-side buffer conveyor 11 moves to the unloading position as shown in the lower half of FIG. 9.

Figure 10:
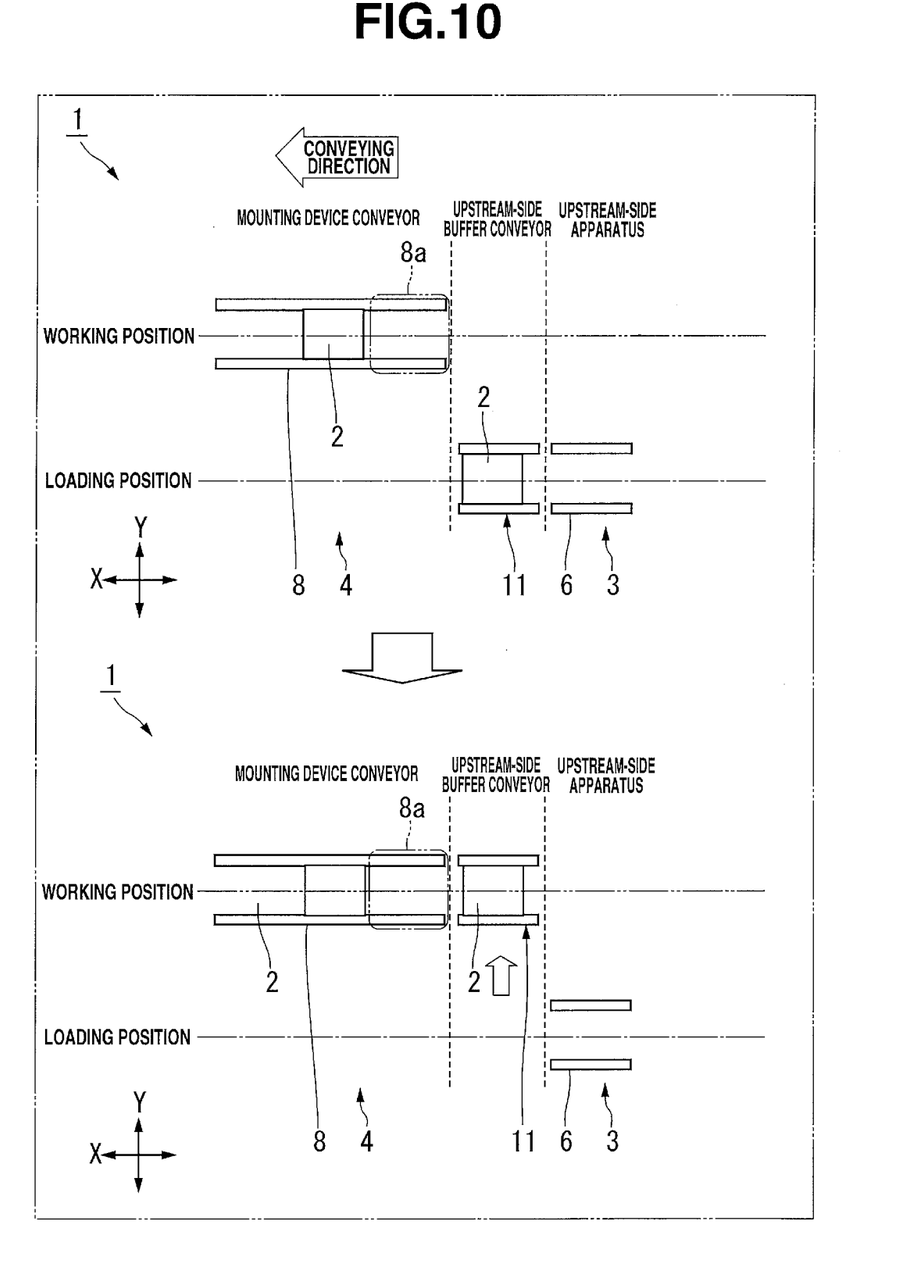
FIG. 10 is a plan view for explaining the operations of the mounting device conveyor and upstream-side buffer conveyor.

Furthermore, if the mounting device conveyor 8 exists in the working position as shown in the upper half of FIG. 10, the upstream-side buffer conveyor 11 moves to the working position as shown in the lower half of FIG. 10.

Subsequently, the upstream-side buffer conveyor 11 moves to the same position as that of the mounting device conveyor 8 in the Y direction, and starts the operation of unloading the printed substrate 2 in step S104.

In the substrate conveying system 1 for the electronic component mounting device 4 configured as described above, the printed substrate 2 to be loaded from the upstream-side apparatus 3 onto the mounting device conveyor 8 or the printed substrate 2 to be unloaded from the mounting device conveyor 8 to the downstream-side apparatus 5 can temporarily be held on the buffer conveyor (the upstream-side buffer conveyor 11 or downstream-side buffer conveyor 12). This can prevent a delay of conveyance of the printed substrate 2 by using the buffer conveyor.

Accordingly, this embodiment can increase the conveyance efficiency of the printed substrate 2 in the substrate conveying system 1 in which the loading and unloading positions of the printed substrate 2 are misaligned in the Y direction.

The above-mentioned buffer conveyors according to this embodiment include the downstream-side buffer conveyor 12 installed between the downstream-side conveyor 7 and mounting device conveyor 8. When the mounting device conveyor 8 has an unloadable printed substrate 2 and the downstream-side buffer conveyor 12 is on standby in the unloading position in the Y direction where the printed substrate 2 is unloaded, the mounting device conveyor 8 moves to the unloading position in the Y direction.

This makes it possible to simultaneously perform the operation of transferring the printed substrate 2 from the downstream-side buffer conveyor 12 to the downstream-side conveyor 7, and the operation of transferring the printed substrate 2 from the mounting device conveyor 8 to the downstream-side buffer conveyor 12. Accordingly, this embodiment can provide the substrate conveying system 1 for the electronic component mounting device 4, which can shorten the time required to unload the printed substrate 2.

When the mounting device conveyor 8 according to this embodiment has an unloadable printed substrate 2, the mounting device conveyor 8 moves to the next position in the Y direction where the step next to the printed substrate unloading step is performed. Also, the downstream-side buffer conveyor 12 according to this embodiment moves to the next position in the Y direction when no printed substrate 2 is placed on the downstream-side buffer conveyor 12.

In this embodiment, the downstream-side buffer conveyor 12 follows the movement of the mounting device conveyor 8. Therefore, the printed substrate 2 in the electronic component mounting device is unloaded from the mounting device conveyor 8 to the downstream-side buffer conveyor 12 while the working steps of the electronic component mounting device are sequentially performed. This minimizes the moving distance of the mounting device conveyor 8 in the Y direction, and increases the conveyance efficiency of the printed substrate 2.

The above-mentioned buffer conveyors according to this embodiment include the upstream-side buffer conveyor 11 installed between the upstream-side conveyor 6 and mounting device conveyor 8. When the mounting device conveyor 8 is on standby in the unloading position in the Y direction where the printed substrate 2 is unloaded, the upstream-side buffer conveyor 11 moves to the unloading position.

In this embodiment, when the printed substrate 2 is unloaded from the mounting device conveyor 8, the next printed substrate 2 is transferred from the upstream-side buffer conveyor 11 to the mounting device conveyor 8.

In this embodiment, therefore, loading and unloading of the printed substrates 2 can be performed at the same time in the mounting device conveyor 8, so the printed substrates 2 are efficiently conveyed.

When the mounting device conveyor 8 is on standby in the working position in the Y direction where the electronic component mounting device 4 performs work, the upstream-side buffer conveyor 11 moves to the working position. Accordingly, when the printed substrate 2 having undergone the work performed by the mounting device conveyor 8 is unloaded, the next printed substrate 2 can be transferred from the upstream-side buffer conveyor 11 to the mounting device conveyor 8.

In this embodiment, therefore, loading and unloading of the printed substrates 2 can be performed at the same time in the mounting device conveyor 8, so the printed substrates 2 are efficiently conveyed.

In the above-described embodiment, the substrate conveying system 1 including the upstream-side buffer conveyor 11 and downstream-side buffer conveyor 12 has been explained. However, the present disclosure is not limited to this embodiment. That is, the substrate conveying system 1 according to the present disclosure can be configured by including one of the upstream-side buffer conveyor 11 and downstream-side buffer conveyor 12.

The invention claimed is:

1. A substrate conveying system for an electronic component mounting device, comprising:
   a mounting device conveyor configured to convey a printed substrate from one end portion to the other end portion of the electronic component mounting device in a first direction that is horizontal;
   an upstream-side conveyor configured to unload the printed substrate from an upstream-side apparatus positioned upstream of the electronic component mounting device in a conveying direction of the printed substrate;
   a downstream-side conveyor configured to load the printed substrate onto a downstream-side apparatus positioned downstream of the electronic component mounting device in the conveying direction of the printed substrate;
   a buffer conveyor arranged between at least one of the upstream-side conveyor and the downstream-side conveyor and the mounting device conveyor; and
   a controller configured to control operations of the mounting device conveyor and the buffer conveyor,
   wherein the mounting device conveyor has a function of moving the printed substrate in a second direction that is horizontal and perpendicular to the conveying direction,
   the upstream-side conveyor is spaced apart from the downstream-side conveyor in the second direction,
   the buffer conveyor has a function of conveying the printed substrate in the first direction, and a function of moving the printed substrate in the second direction,
   the printed substrate is transferred from one of the mounting device conveyor and the buffer conveyor to the other in a state in which the mounting device conveyor and the buffer conveyor are positioned in the same position in the second direction,
   the buffer conveyor includes a downstream-side buffer conveyor installed between the downstream-side conveyor and the mounting device conveyor, and
   the controller is configured to:
   i) determine whether the downstream-side buffer conveyor is waiting for unloading of the printed substrate from the mounting device conveyor,
   ii) determine whether a processed printed substrate and a printed substrate to be processed next exist on the mounting device conveyor, when the controller has determined that the downstream-side buffer conveyor is waiting for unloading of the printed substrate,
   iii) move the mounting device conveyor to a next position in the second direction where a step next to the printed substrate unloading step is performed, when the controller has determined that the processed printed substrate and the printed substrate to be processed next exist on the mounting device conveyor, and
   iv) move the downstream-side buffer conveyor having unloaded the printed substrate to the same position in the second direction as that of the mounting device conveyor.

2. The substrate conveying system for an electronic component mounting device according to claim 1, wherein the controller is configured to move the mounting device conveyor to the same position in the second direction as that of the downstream-side buffer conveyor, when the controller has determined that the downstream-side buffer conveyor is waiting for unloading of the printed substrate and that the processed printed substrate exists and the printed substrate to be processed next does not exist on the mounting device conveyor.

3. The substrate conveying system for an electronic component mounting device according to claim 1, wherein the buffer conveyor includes an upstream-side buffer conveyor installed between the upstream-side conveyor and the mounting device conveyor, and
   the controller is configured to:
   v) check a position of the mounting device conveyor,
   vi) determine whether the mounting device conveyor is capable of loading the printed substrate, and
   vii) move the upstream-side buffer conveyor to the same position in the second direction as that of the mounting device conveyor, when the controller has determined that the mounting device conveyor is capable of loading the printed substrate by the mounting device conveyor being in an unloading position where the printed substrate is unloaded and by the printed substrate to be processed next not existing on the mounting device conveyor.

4. The substrate conveying system for an electronic component mounting device according to claim 1, wherein the buffer conveyor includes an upstream-side buffer conveyor installed between the upstream-side conveyor and the mounting device conveyor, and
   the controller is configured to:
   v) check a position of the mounting device conveyor,
   vi) determine whether the mounting device conveyor is capable of loading the printed substrate, and
   viii) move the upstream-side buffer conveyor to the same position in the second direction as that of the mounting device conveyor, when the controller has determined that the mounting device conveyor is capable of loading the printed substrate by the mounting device conveyor being in a working position where the electronic component mounting device performs work and by the printed substrate to be processed next not existing on the mounting device conveyor.

* * * * *